(12) United States Patent
Meng et al.

(10) Patent No.: US 11,444,263 B2
(45) Date of Patent: Sep. 13, 2022

(54) FLEXIBLE DISPLAY PANEL, AND DISPLAY DEVICE HAVING THIN FILM PACKAGING LAYER WITH PROTRUSIONS

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Xiaodong Meng, Beijing (CN); Lingling Ma, Beijing (CN); Zihua Li, Beijing (CN); Zhibo Wen, Beijing (CN); Hengbo Liu, Beijing (CN); Yu Yuan, Beijing (CN); Lu Cai, Beijing (CN); Dong Xu, Beijing (CN); Guofang Xu, Beijing (CN); Xinpeng Gao, Beijing (CN); Qiang Wang, Beijing (CN); Ruiqing Zhang, Beijing (CN); Qiang Guo, Beijing (CN); Wenqiang Jin, Beijing (CN); Xudong Wang, Beijing (CN)

(73) Assignees: Ordos Yuansheng Optoelectronics Co., Ltd., Ordos (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 16/765,052

(22) PCT Filed: Oct. 12, 2019

(86) PCT No.: PCT/CN2019/110758
§ 371 (c)(1),
(2) Date: May 18, 2020

(87) PCT Pub. No.: WO2020/088218
PCT Pub. Date: May 7, 2020

(65) Prior Publication Data
US 2020/0365826 A1 Nov. 19, 2020

(30) Foreign Application Priority Data

Nov. 2, 2018 (CN) .......................... 201821801419.7

(51) Int. Cl.
*H01L 51/00* (2006.01)
*H01L 51/52* (2006.01)
(Continued)

(52) U.S. Cl.
CPC ...... *H01L 51/5253* (2013.01); *H01L 51/0097* (2013.01); *H01L 51/56* (2013.01);
(Continued)

(58) Field of Classification Search
CPC ............ H01L 51/5253; H01L 51/0097; H01L 2251/301; H01L 2251/5338; H01L 33/22; H01L 33/24
See application file for complete search history.

(56) References Cited

U.S. PATENT DOCUMENTS 8,946,747 B2 * 2/2015 Reiherzer ............. H01L 33/505
257/98
9,013,099 B2 * 4/2015 Wang .................. H01L 51/5256
313/506
(Continued)

FOREIGN PATENT DOCUMENTS

CN 206610830 U 11/2017
CN 107644946 A 1/2018
(Continued)

OTHER PUBLICATIONS

International Search Report and Written Opinion for Application No. PCT/CN2019/110758, dated Jan. 9, 2020, 10 Pages.

*Primary Examiner* — Ida M Soward
(74) *Attorney, Agent, or Firm* — Brooks Kushman P.C.

(57) ABSTRACT

A flexible display panel. The flexible display panel includes: a flexible substrate; a display element arranged on the
(Continued)

flexible substrate; and a packaging layer covering the display element, the packaging layer including an inorganic thin film and an organic thin film that are stacked alternately, in which two protrusion structures that are engaged with each other are arranged between at least two adjacent thin films of the packaging layer.

8 Claims, 3 Drawing Sheets

(51) Int. Cl.
 *H01L 33/22* (2010.01)
 *H01L 33/24* (2010.01)
 *H01L 51/56* (2006.01)
(52) U.S. Cl.
 CPC .............. *H01L 33/22* (2013.01); *H01L 33/24* (2013.01); *H01L 2251/301* (2013.01); *H01L 2251/5338* (2013.01)

(56) References Cited

U.S. PATENT DOCUMENTS

| | | | | |
|---|---|---|---|---|
| 9,070,889 B2* | 6/2015 | Lee | ................. | H01L 51/448 |
| 9,257,674 B2* | 2/2016 | Lee | ................. | H01L 51/5268 |
| 9,303,840 B2* | 4/2016 | Cho | ................. | H01L 51/5253 |
| 9,859,340 B2* | 1/2018 | Kikuchi | ............. | H01L 51/5206 |
| 10,074,826 B2* | 9/2018 | Park | ................. | H01L 27/3211 |
| 10,079,362 B2* | 9/2018 | Kim | ................. | H01L 51/5268 |
| 10,115,929 B2* | 10/2018 | Huang | ............. | H01L 51/5237 |
| 10,128,462 B2* | 11/2018 | Son | ................. | H01L 51/5259 |
| 10,177,344 B2* | 1/2019 | Wang | ............... | H01L 51/5268 |
| 10,181,578 B2* | 1/2019 | Li | ..................... | H01L 51/5256 |
| 10,263,214 B2* | 4/2019 | Riegel | ............. | H01L 51/5253 |
| 10,297,794 B2* | 5/2019 | Sung | ............... | H01L 51/5237 |
| 10,476,029 B2* | 11/2019 | Gong | ................. | H01L 51/56 |
| 10,629,851 B2* | 4/2020 | Chen | ................. | H01L 51/52 |
| 10,868,271 B2* | 12/2020 | Nishizaki | ......... | H01L 51/56 |
| 11,081,671 B2* | 8/2021 | Zhang | ............. | H01L 51/5256 |
| 2010/0019664 A1* | 1/2010 | Mishima | ......... | H01L 51/5268 |
| | | | | 313/504 |
| 2013/0207141 A1* | 8/2013 | Reiherzer | ......... | H01L 33/505 |
| | | | | 257/E33.072 |
| 2016/0172624 A1* | 6/2016 | Fukuda | ........... | H01L 51/5253 |
| | | | | 257/40 |
| 2016/0301034 A1* | 10/2016 | Hsu | ................. | H01L 51/5275 |
| 2016/0365539 A1* | 12/2016 | Wang | ............... | H01L 27/3272 |
| 2017/0117504 A1* | 4/2017 | Kim | ................. | H01L 27/3244 |
| 2017/0271623 A1 | 9/2017 | Wang et al. | | |
| 2019/0237699 A1* | 8/2019 | Hu | ................... | H01L 27/3276 |
| 2020/0350518 A1* | 11/2020 | Park | ................. | B29D 11/0073 |
| 2021/0234129 A1* | 7/2021 | Zhang | ............. | H01L 51/0097 |

FOREIGN PATENT DOCUMENTS

| | | |
|---|---|---|
| CN | 108539041 A | 9/2018 |
| CN | 208753371 U | 4/2019 |

* cited by examiner

FLEXIBLE DISPLAY PANEL, AND DISPLAY DEVICE HAVING THIN FILM PACKAGING LAYER WITH PROTRUSIONS

CROSS-REFERENCE TO RELATED APPLICATIONS

This application is the U.S. national phase of PCT Application No. PCT/CN2019/110758 filed on Oct. 12, 2019, which claims priority to Chinese Patent Application No. 201821801419.7 filed on Nov. 2, 2018, which are incorporated herein by reference in their entireties.

TECHNICAL FIELD

The present disclosure relates to the field of display technology, in particular to a flexible display panel, a method for packing the same, and a display device.

BACKGROUND

Currently, flexible organic light emitting diode (OLED) display panels are generally packaged with thin films.

SUMMARY

A technical problem to be solved by the present disclosure is to provide a flexible display panel and a display device, which are capable of improving the packaging effect of the flexible display panel, effectively blocking the invasion of water and oxygen, and increasing the service life of the flexible display panel.

To solve the above technical problems, the embodiments of the present disclosure provide technical solutions as follows.

An embodiment of the present disclosure provides a flexible display panel including: a flexible substrate; a display element arranged on the flexible substrate; and a packaging layer covering the display element, the packaging layer including an inorganic thin film and an organic thin film that are stacked alternately, in which two protrusion structures that are engaged with each other are arranged between at least two adjacent thin films of the packaging layer.

Optionally, the protrusion structure includes a plurality of protrusions arranged in an array.

Optionally, a longitudinal section of each protrusion perpendicular to the flexible substrate is a semi-ellipse, a semi-circle, or a trapezoid.

Optionally, the packaging layer includes a first inorganic thin film, an organic thin film, and a second inorganic thin film that are stacked sequentially.

Optionally, a first protrusion structure and a second protrusion structure that are engaged with each other are arranged between the first inorganic thin film and the organic thin film.

Optionally, the first protrusion structure and the first inorganic thin film are of an integrated structure.

Optionally, a third protrusion structure and a fourth protrusion structure that are engaged with each other are arranged between the organic thin film and the second inorganic thin film.

Optionally, the third protrusion structure and the organic thin film are of an integrated structure.

Optionally, the display element is an OLED display element.

An embodiment of the present disclosure also provides a display device including the flexible display panel as described above.

An embodiment of the present disclosure also provides a method for packaging a flexible display panel including: alternately depositing an inorganic thin film and an organic thin film on a display element arranged on a flexible substrate to form a packaging layer covering the display element, and forming two protrusion structures that are engaged with each other between at least two adjacent thin films of the packaging layer.

Optionally, the alternately depositing the inorganic thin film and the organic thin film includes: sequentially depositing a first inorganic thin film, depositing an organic thin film, and depositing a second inorganic thin film.

Optionally, the forming two protrusion structures that are engaged with each other between at least two adjacent thin films of the packaging layer further includes: depositing a first protrusion structure on the first inorganic thin film.

Optionally, the depositing the first inorganic thin film includes: depositing a first inorganic thin film integrated with the first protrusion structure on the display element arranged on the flexible substrate.

Optionally, the forming two protrusion structures that are engaged with each other between at least two adjacent thin films of the packaging layer further includes: depositing a third protrusion structure on the organic thin film.

Optionally, the depositing the organic thin film includes: depositing an organic thin film integrated with the third protrusion structure on the first inorganic thin film.

Embodiments of the present disclosure have the following advantageous effects.

In the above solutions, two protrusion structures that are engaged with each other are arranged between at least two adjacent thin films of the packaging layer. The two protrusion structures that are engaged with each other are capable of increasing the bite force between two adjacent thin films, so that the tightness between the two adjacent thin films increases. This arrangement solves the problem that the inorganic thin film and the organic thin film are prone to film separation during bending, which is capable of improving the packaging effect of the flexible display panel, effectively blocking the invasion of water and oxygen, and increasing the service life of the flexible display panel.

DETAILED DESCRIPTION

Figure 1:
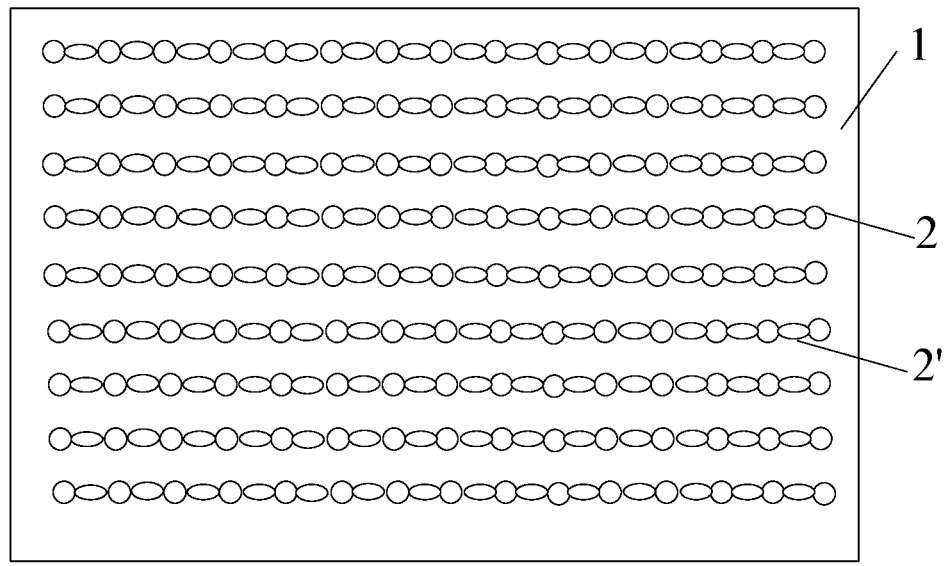
FIG. 1 is a schematic view showing the forming a first protrusion structure on a first inorganic thin film according to an embodiment of the present disclosure.

In order to make the technical problems to be solved, the technical solutions, and the advantages of the embodiments of the present disclosure, the present disclosure will be described hereinafter in conjunction with the drawings and specific examples.

Flexible organic light emitting diode (OLED) display panels are generally packaged with thin films, and the packaging layer includes an inorganic thin film and an organic thin film that are stacked alternately. Inorganic thin films are relatively dense and are capable of effectively blocking water and oxygen from invading OLED devices, however, there are film stresses in the inorganic thin film, which is prone to cracking and peeling during bending and folding. The inorganic thin film needs a certain thickness to effectively block water and oxygen, but the increase in thickness also increases the stress of the inorganic thin film, so that the thin film is more prone to cracking and peeling during bending and folding. An organic thin film may solve this problem, but when the flexible OLED display panel is bent, the inorganic thin film and the organic thin film are prone to being separated, thereby causing the failure of the packaging layer.

For the problem that when the flexible OLED display panel is bent, the inorganic thin film and the organic thin film are prone to being separated, thereby causing the failure of the packaging layer in the related art, the embodiments of the present disclosure provide a flexible display panel and a display device, which are capable of improving the packaging effect of the flexible display panel, effectively blocking the invasion of water and oxygen, and increasing the service life of the flexible display panel.

An embodiment of the present disclosure provides a flexible display panel including: a flexible substrate; a display element arranged on the flexible substrate; and a packaging layer covering the display element, the packaging layer including an inorganic thin film and an organic thin film that are stacked alternately, in which two protrusion structures that are engaged with each other are arranged between at least two adjacent thin films of the packaging layer.

In this embodiment, two protrusion structures that are engaged with each other are arranged between at least two adjacent thin films of the packaging layer, and the two protrusion structures that are engaged with each other are capable of increasing the bite force between two adjacent thin films, so that the tightness between the two adjacent thin films increases. This arrangement solves the problem that the inorganic thin film and the organic thin film are prone to film separation during bending, which is capable of improving the packaging effect of the flexible display panel, effectively blocking the invasion of water and oxygen, and increasing the service life of the flexible display panel.

Optionally, the protrusion structure includes a plurality of protrusions, and each protrusion may be arranged regularly or irregularly. Optionally, the protrusion structure includes a plurality of protrusions arranged in an array.

Optionally, the longitudinal section of the protrusion perpendicular to the flexible substrate may be a semi-ellipse, a semi-circle, or a trapezoid. Of course, the longitudinal section of the protrusion perpendicular to the flexible substrate is not limited to a semi-ellipse, a semi-circle, or a trapezoid, and may also be other shapes, such as rectangular.

The packaging layer is composed of multiple layers of inorganic thin films and organic thin films that are stacked alternately. The more layers the inorganic thin films and the organic thin films have, the better the packaging effect is, but the thickness and cost of the flexible display panel also increase at the same time.

Optionally, the packaging layer includes a first inorganic thin film, organic thin film, and a second inorganic thin film that are stacked sequentially, so that it not only ensures the packaging effect of the packaging layer, but also makes the thickness of the flexible display panel relatively small.

In some specific embodiments, a first protrusion structure and a second protrusion structure that are engaged with each other are arranged between the first inorganic thin film and the organic thin film. The first protrusion structure can increase the bite force between the first inorganic thin film and the organic thin film, so that the tightness between the first inorganic thin film and the organic thin film increases. In this way, when the flexible display panel is bent, the inorganic thin film and the organic thin film are not prone to separation, which is capable of improving the packaging effect of the flexible display panel, effectively blocking the invasion of water and oxygen, and increasing the service life of the flexible display panel.

Optionally, the first protrusion structure and the first inorganic thin film are of an integrated structure, so that the first protrusion structure and the first inorganic thin film can be combined more closely. In addition, the material of the first protrusion structure is same as the material of the first inorganic thin film, which can play a role of blocking the invasion of water and oxygen by the first inorganic thin film. Therefore, there is no need to design the thickness of the first inorganic thin film to be too thick, which may reduce the thickness of the first inorganic thin film, thereby solving the problem that the first inorganic thin film is prone to film cracking due to its large thickness during bending.

In some specific embodiments, a third protrusion structure and a fourth protrusion structure that are engaged with each other are arranged between the organic thin film and the second inorganic thin film. The third protrusion structure can increase the bite force between the second inorganic thin film and the organic thin film, so that the tightness between the second inorganic thin film and the organic thin film increases. In this way, when the flexible display panel is bent, the second inorganic thin film and the organic thin film are not prone to separation, which is capable of improving the packaging effect of the flexible display panel, effectively blocking the invasion of water and oxygen, and increasing the service life of the flexible display panel.

Optionally, the material of the third protrusion structure may be same as the material of the organic thin film, or may be same as the material of the second inorganic thin film. When the material of the third protrusion structure is same as the material of the second inorganic thin film, it can play a role of blocking the invasion of water and oxygen by the second inorganic thin film. Therefore, there is no need to design the thickness of the second inorganic thin film to be too thick, which may reduce the thickness of the second inorganic thin film, thereby solving the problem that the second inorganic thin film is prone to film cracking due to its large thickness during bending.

Optionally, the third protrusion structure is integrated with the organic thin film, so that the third protrusion structure and the organic thin film can be combined more closely, thereby increasing the tightness among the organic thin film, the protrusion, and the second inorganic thin film.

Specifically, the display element may be an OLED display element. Of course, the display element is not limited to an OLED display element, and may also be another type of display element, such as a quantum dot light emitting element.

An embodiment of the present disclosure also provides a method for packaging a flexible display panel including: alternately depositing an inorganic thin film and an organic thin film on a display element arranged on a flexible substrate to form a packaging layer covering the display element, and forming two protrusion structures that are engaged with each other between at least two adjacent thin films of the packaging layer.

The alternately depositing the inorganic thin film and the organic thin film includes: sequentially depositing a first inorganic thin film, depositing an organic thin film, and depositing a second inorganic thin film.

The forming two protrusion structures that are engaged with each other between at least two adjacent thin films of the packaging layer further includes: depositing a first protrusion structure on the first inorganic thin film.

The depositing the first inorganic thin film includes: depositing a first inorganic thin film integrated with the first protrusion structure on the display element arranged on the flexible substrate.

The forming two protrusion structures that are engaged with each other between at least two adjacent thin films of the packaging layer further includes: depositing a third protrusion structure on the organic thin film.

The depositing the organic thin film includes: depositing an organic thin film integrated with the third protrusion structure on the first inorganic thin film.

The flexible display panel of the present disclosure will be further described in detail below in conjunction with the accompanying drawings and specific embodiments.

Figure 2:
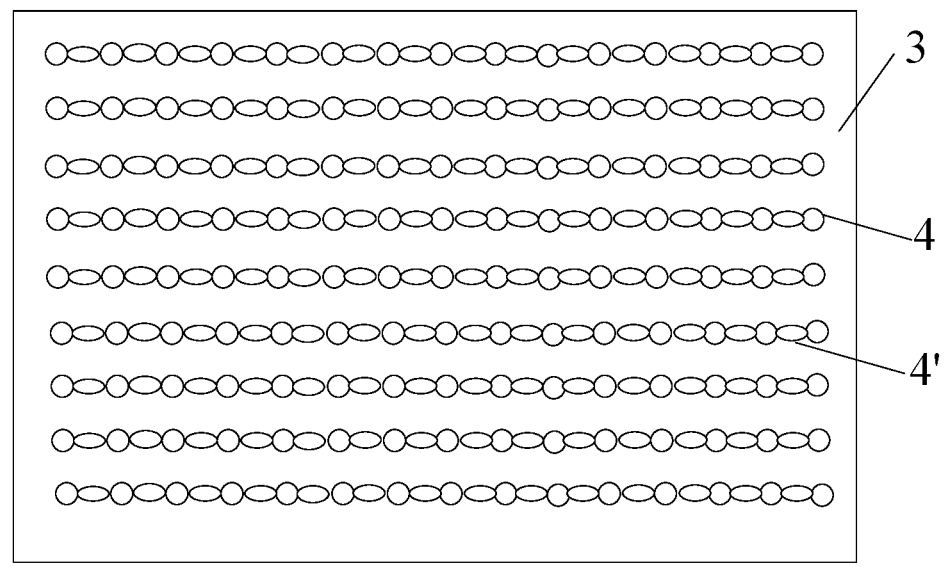
FIG. 2 is a schematic view showing the forming a third protrusion structure on an organic thin film according to an embodiment of the present disclosure.
Figure 3:
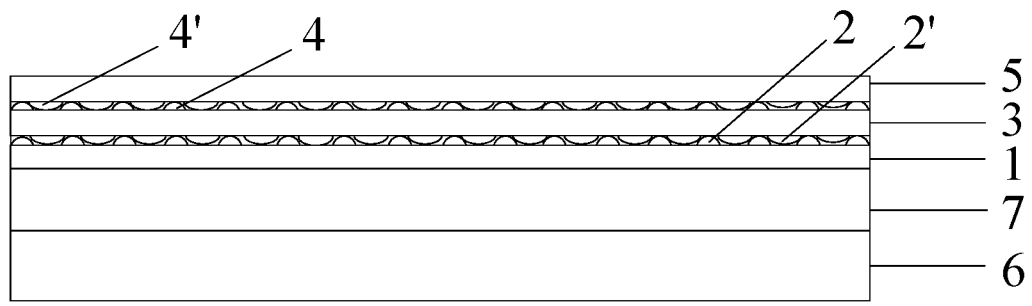
FIG. 3 is a schematic view showing a cross section of a flexible display panel according to an embodiment of the present disclosure.

As shown in FIGS. 1 to 3, the flexible display panel of the present disclosure includes a flexible substrate 6, a display element 7 arranged on the flexible substrate 6, and a packaging layer covering the display element 7. The packaging layer includes a first inorganic thin film 1, an organic thin film 3, and a second inorganic thin film 5 that are stacked sequentially. The first inorganic thin film 1 is provided with a first protrusion structure 2, the organic thin film 3 is provided with a second protrusion structure 2' and the third protrusion structure 4, and the second inorganic thin film 5 is provided with a fourth protrusion structure 4'.

Specifically, when a flexible display panel is prepared, an inorganic material layer is deposited on the flexible substrate 6 on which the display element 7 is formed, and the inorganic material may be silicon nitride or silicon oxide. After a photoresist is coated on the inorganic material layer and the photoresist is exposed and developed by using a mask, a photoresist reserved region and a photoresist removed region are formed. The inorganic material layer in the photoresist removed region is etched to remove a part of the inorganic material layer in the photoresist removed region, thereby forming an integrated structure of the first inorganic thin film 1 and the first protrusion structure 2, in which the first protrusion structure 2 corresponds to the photoresist reserved region.

Optionally, an organic material layer is deposited on the flexible substrate 6 on which the first inorganic thin film 1 and the first protrusion structure 2 are formed, and the organic material may be a light-sensitive material. After the organic material layer is exposed and developed by using a mask, an organic thin film 3 and a third protrusion structure 4 are formed in an integrated structure, in which the third protrusion structure 4 corresponds to the opaque region of the mask.

Thereafter, an inorganic material layer is deposited as the second inorganic thin film 5 on the flexible substrate 6 on which the organic thin film 3 and the third protrusion structure 4 are formed, and the inorganic material may be silicon nitride or silicon oxide.

In this embodiment, two protrusion structures are arranged between two adjacent thin films of the packaging layer, and the two protrusion structures are capable of increasing the bite force between two adjacent thin films, so that the tightness between the two adjacent thin films increases. This arrangement solves the problem that the inorganic thin film and the organic thin film are prone to film separation during bending, which is capable of improving the packaging effect of the flexible display panel, effectively blocking the invasion of water and oxygen, and increasing the service life of the flexible display panel.

An embodiment of the present disclosure also provides a display device including the flexible display panel as described above. The display device may be any product or component having a display function, such as a television, a display, a digital photo frame, a mobile phone, a tablet computer, etc., in which the display device further includes a flexible circuit board, a printed circuit board, and a backplane.

Figure 4:
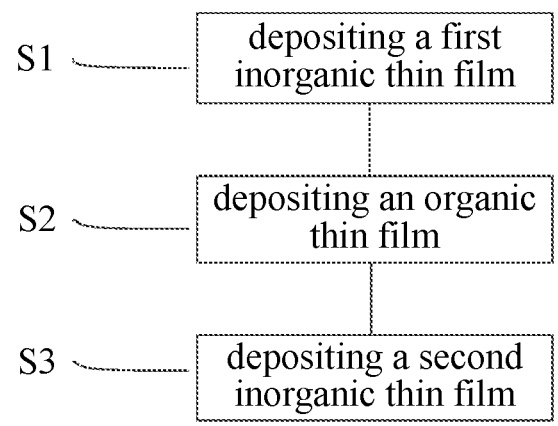
FIGS. 4 and 5 are schematic views showing a method for packaging a flexible display panel according to an embodiment of the present disclosure.
Figure 5:
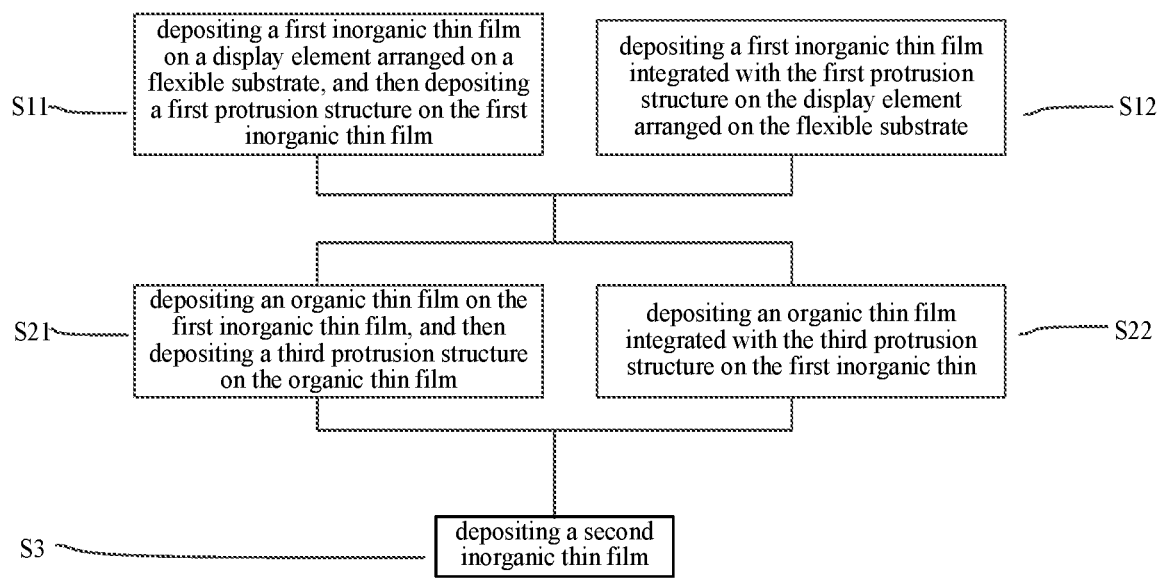

As shown in FIGS. 4 and 5, a method for packaging a flexible display panel includes: alternately depositing an inorganic thin film and an organic thin film on a display element arranged on a flexible substrate to form a packaging layer covering the display element; and forming two protrusion structures that are engaged with each other between at least two adjacent thin films of the packaging layer.

The alternately depositing the inorganic thin film and the organic thin film includes: sequentially S1 depositing a first inorganic thin film, S2 depositing an organic thin film, and S3 depositing a second inorganic thin film.

S1 depositing the first inorganic thin film includes: S11 depositing a first inorganic thin film on a display element arranged on a flexible substrate, and then depositing a first protrusion structure on the first inorganic thin film; or S12 depositing a first inorganic thin film integrated with the first protrusion structure on the display element arranged on the flexible substrate.

S2 depositing the organic thin film includes: S21 depositing an organic thin film on the first inorganic thin film, and then depositing a third protrusion structure on the organic thin film; or S22 depositing an organic thin film integrated with the third protrusion structure on the first inorganic thin.

Unless otherwise defined, technical terms or scientific terms used herein have the normal meaning commonly understood by one skilled in the art in the field of the present disclosure. The words "first", "second", and the like used in the present disclosure do not denote any order, quantity, or importance, but rather merely serve to distinguish different components. The "including", "comprising", or the like used in the present disclosure means that the element or item appeared in front of the word encompasses the element or item and their equivalents listed after the word, and does exclude other elements or items. The word "connected" or "connecting" or the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

It can be understood that the expression "two protrusion structures that are engaged with each other" means that the protrusions in the two protrusion structures are arranged alternately in a straight line in a zipper manner.

The above description are preferred embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A flexible display panel, comprising:
a flexible substrate;
a display element arranged on the flexible substrate; and
a packaging layer covering the display element, the packaging layer comprising an inorganic thin film and an organic thin film that are stacked alternately, and comprising a first inorganic thin film, an organic thin film, and a second inorganic thin film that are stacked sequentially,
wherein two protrusion structures that are engaged with each other are arranged between at least two adjacent thin films of the packaging layer, and a longitudinal section of each protrusion perpendicular to the flexible substrate is a semi-ellipse or a semi-circle,
wherein a first protrusion structure and a second protrusion structure that are engaged with each other are arranged between the first inorganic thin film and the organic thin film, and the first protrusion structure and the first inorganic thin film are of an integrated structure,
wherein a third protrusion structure and a fourth protrusion structure that are engaged with each other are arranged between the organic thin film and the second inorganic thin film, and the third protrusion structure and the organic thin film are of an integrated structure.

2. The flexible display panel of claim 1, wherein the protrusion structure comprises a plurality of protrusions arranged in an array.

3. A display device, comprising the flexible display panel of claim 1.

4. The display device of claim 3, wherein the protrusion structure comprises a plurality of protrusions arranged in an array.

5. A method for packaging a flexible display panel, wherein the flexible display panel comprises:
a flexible substrate;
a display element arranged on the flexible substrate; and
a packaging layer covering the display element, the packaging layer comprising an inorganic thin film and an organic thin film that are stacked alternately, and comprising a first inorganic thin film, an organic thin film, and a second inorganic thin film that are stacked sequentially,
wherein two protrusion structures that are engaged with each other are arranged between at least two adjacent thin films of the packaging layer, and a longitudinal section of each protrusion perpendicular to the flexible substrate is a semi-ellipse or a semi-circle,
wherein a first protrusion structure and a second protrusion structure that are engaged with each other are arranged between the first inorganic thin film and the organic thin film, and the first protrusion structure and the first inorganic thin film are of an integrated structure,
wherein a third protrusion structure and a fourth protrusion structure that are engaged with each other are arranged between the organic thin film and the second inorganic thin film, and the third protrusion structure and the organic thin film are of an integrated structure,
the method comprising:
alternately depositing an inorganic thin film and an organic thin film on a display element arranged on a flexible substrate to form a packaging layer covering the display element; and
forming two protrusion structures that are engaged with each other between at least two adjacent thin films of the packaging layer.

6. The method of claim 5, wherein the alternately depositing the inorganic thin film and the organic thin film comprises: sequentially depositing a first inorganic thin film, depositing an organic thin film, and depositing a second inorganic thin film.

7. The method of claim 6, wherein the depositing the first inorganic thin film comprises: depositing a first inorganic thin film integrated with the first protrusion structure on the display element arranged on the flexible substrate.

8. The method of claim 6, wherein the depositing the organic thin film comprises: depositing an organic thin film integrated with the third protrusion structure on the first inorganic thin film.

* * * * *